(12) United States Patent
Lee et al.

(10) Patent No.: US 11,776,906 B2
(45) Date of Patent: Oct. 3, 2023

(54) SEMICONDUCTOR DEVICE

(71) Applicant: Samsung Electronics Co., Ltd., Suwon-si (KR)

(72) Inventors: Jangho Lee, Hwaseong-si (KR); Jongmin Baek, Hwaseong-si (KR); Wookyung You, Hwaseong-si (KR); Kyu-Hee Han, Hwaseong-si (KR); Suhyun Bark, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 24 days.

(21) Appl. No.: 17/480,615

(22) Filed: Sep. 21, 2021

(65) Prior Publication Data

US 2022/0005763 A1 Jan. 6, 2022

Related U.S. Application Data

(63) Continuation of application No. 16/793,366, filed on Feb. 18, 2020, now Pat. No. 11,139,244.

(30) Foreign Application Priority Data

Jul. 1, 2019 (KR) .......................... 10-2019-0078599

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76832* (2013.01); *H01L 21/76843* (2013.01); *H01L 23/5226* (2013.01)

(58) Field of Classification Search
CPC ............. H01L 23/5283; H01L 23/5226; H01L 21/76832; H01L 21/76843
USPC ....................................................... 257/734
See application file for complete search history.

(56) References Cited

U.S. PATENT DOCUMENTS

| | | | |
|---|---|---|---|
| 9,324,650 B2 | 4/2016 | Edelstein et al. |
| 9,437,484 B2 | 9/2016 | JangJian et al. |
| 9,496,169 B2 | 11/2016 | Tung et al. |
| 9,685,368 B2 | 6/2017 | Tsai et al. |
| 9,966,337 B1 | 5/2018 | Briggs et al. |
| 10,177,028 B1 | 1/2019 | LiCausi et al. |

(Continued)

OTHER PUBLICATIONS

CA Notice of Allowance dated Jun. 9, 2021 in U.S. Appl. No. 16/793,366.

*Primary Examiner* — Tu-Tu V Ho
(74) *Attorney, Agent, or Firm* — HARNESS, DICKEY & PIERCE, P.L.C.

(57) ABSTRACT

Disclosed is a semiconductor device comprising a substrate, a first dielectric layer on the substrate, a first lower conductive line in the first dielectric layer, an etch stop layer on the first dielectric layer, a via-structure that penetrates the etch stop layer and connects to the first lower conductive line, a second dielectric layer on the etch stop layer, and an upper conductive line that penetrates the second dielectric layer and connects to the via-structure. The first dielectric layer includes a dielectric pattern at a level higher than a top surface of the first lower conductive line. The upper conductive line is in contact with a top surface of the etch stop layer. The etch stop layer has at an upper portion a rounded surface in contact with the via-structure.

20 Claims, 14 Drawing Sheets

(56) References Cited

U.S. PATENT DOCUMENTS

2014/0151893 A1* 6/2014 Boyanov ........... H01L 21/76883
 257/774
2017/0186682 A1* 6/2017 Anderson ......... H01L 21/31053
2018/0040510 A1 2/2018 Briggs et al.
2019/0043803 A1 2/2019 You et al.

* cited by examiner

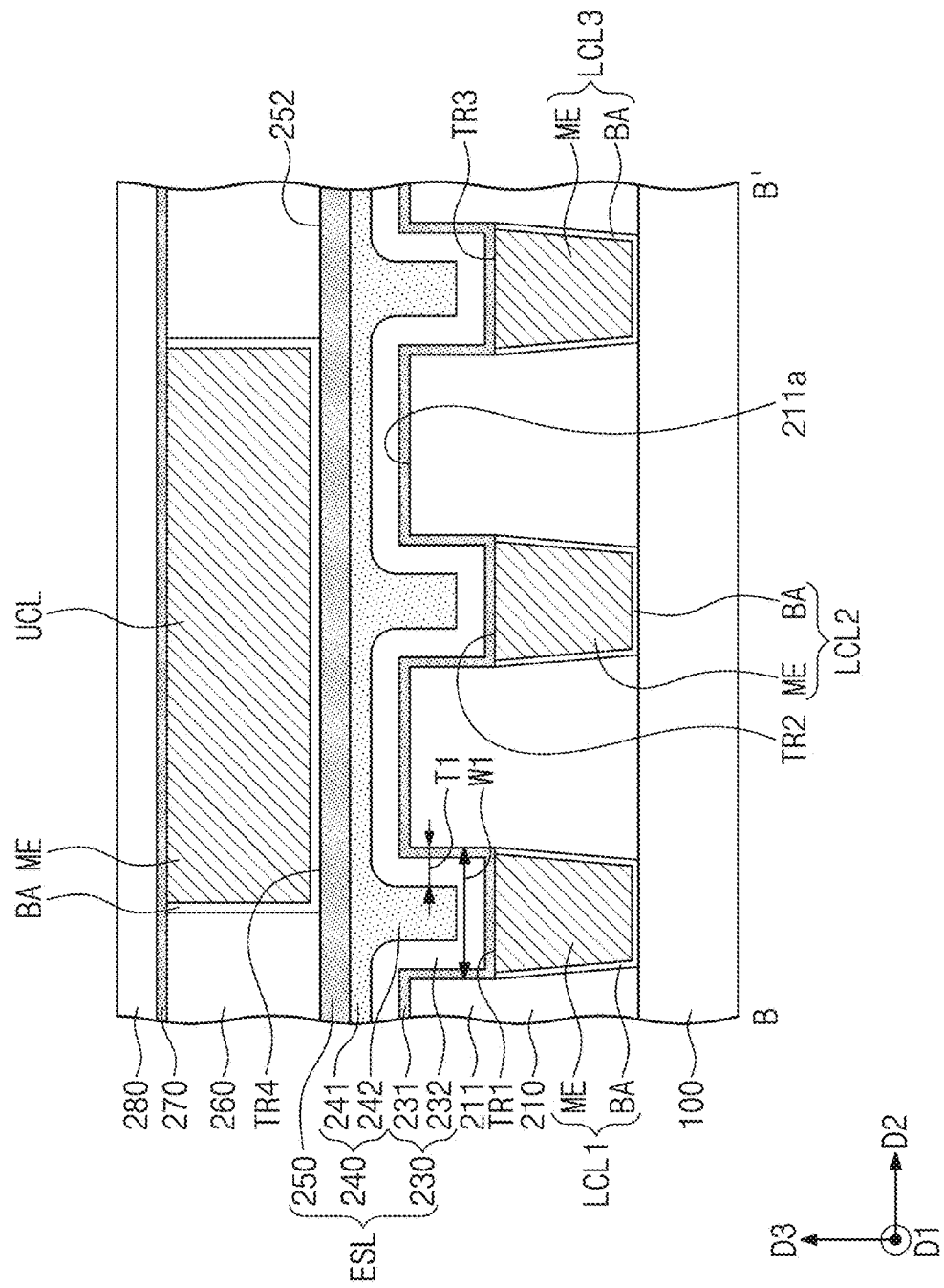

SEMICONDUCTOR DEVICE

CROSS-REFERENCE TO RELATED APPLICATIONS

This U.S. nonprovisional application is a Continuation of U.S. application Ser. No. 16/793,366, filed on Feb. 18, 2020, which claims priority under 35 U.S.C § 119 to Korean Patent Application No. 10-2019-0078599 filed on Jul. 1, 2019 in the Korean Intellectual Property Office, the entire contents of each of which are hereby incorporated by reference.

BACKGROUND

The present inventive concepts relate to a semiconductor device. More particularly, the present inventive concepts relate to a semiconductor device whose etch stop layer includes a rounded surface.

Semiconductor devices are widely used in the electronics industry because of their small size, multi-functionality, and/or low manufacturing cost. Semiconductor devices may encompass memory devices for storing data, logic devices for processing data, and hybrid devices for operating various functions contemporaneously or simultaneously.

With new developments and advancements in the electronics industry, smaller semiconductor devices have been increasingly. However, it is increasingly difficult to manufacture semiconductor devices because defining fine patterns within the process margin in an exposure process increases in difficulty as the devices grow smaller. Higher speed semiconductor devices have also been increasingly required with the advancement of the electronic industry. Various structures have been studied to find solutions for the growing need for high integration and/or high-speed semiconductor devices while still maintaining reliability.

SUMMARY

According to some example embodiments, a semiconductor device may comprise: a substrate; a first dielectric layer on the substrate; a first lower conductive line in the first dielectric layer; an etch stop layer on the first dielectric layer; a via-structure that penetrates the etch stop layer and connects to the first lower conductive line; a second dielectric layer on the etch stop layer; and an upper conductive line that penetrates the second dielectric layer and connects to the via-structure. The first dielectric layer may include a dielectric pattern at a level higher than a top surface of the first lower conductive line. The upper conductive line may be in contact with a top surface of the etch stop layer. The etch stop layer may have at an upper portion with a rounded surface in contact with the via-structure.

According to some example embodiments, a semiconductor device may comprise: a substrate; a first dielectric layer on the substrate; a first lower conductive line, a second lower conductive line, and a third lower conductive line that are sequentially arranged in a first direction in the first dielectric layer; an etch stop layer on the first dielectric layer; a via-structure that penetrates the etch stop layer and connects to the second lower conductive line; a second dielectric layer on the etch stop layer; and an upper conductive line that penetrates the second dielectric layer and connects to the via-structure. The first dielectric layer may include a plurality of dielectric patterns at a level higher than top surfaces of the first, second, and third lower conductive lines. The upper conductive line may be in contact with a top surface of the etch stop layer. The etch stop layer may include a first etch stop pattern that conformally covers the first dielectric layer, a second etch stop pattern on the first etch stop pattern, and a third etch stop pattern on the second etch stop pattern. The third etch stop pattern may have a rounded surface in contact with the via-structure.

According to some example embodiments, a semiconductor device may comprise: a substrate; a first dielectric layer on the substrate; a first lower conductive line in the first dielectric layer; an etch stop layer on the first dielectric layer; a via-structure that penetrates the etch stop layer and connects to the first lower conductive line; a second dielectric layer on the etch stop layer; and an upper conductive line in the second dielectric layer and connected to the via-structure. The first dielectric layer may include a dielectric pattern at a level higher than a level of the first lower conductive line. The second dielectric layer may include an insert segment between the upper conductive line and the etch stop layer. The insert segment may have a rounded surface in contact with the via-structure. The etch stop layer may have a rounded surface in contact with the via-structure.

BRIEF DESCRIPTION OF THE DRAWINGS

FIG. 2B illustrates a cross-sectional view taken along line B-B' of FIG. 1.

DETAILED DESCRIPTION OF EMBODIMENTS

Although the terms "first," "second," "third," etc., may be used herein to describe various elements, components, regions, layers, and/or sections, these elements, components, regions, layers, and/or sections, should not be limited by these terms. These terms are only used to distinguish one element, region, layer, or section, from another element, region, layer, or section. Thus, a first element, component, region, layer, or section, discussed below may be termed a second element, component, region, layer, or section, without departing from the scope of this disclosure.

Spatially relative terms, such as "below," "lower," "upper," "top," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example terms "below" may encompass both an orientation of above and below. The device may be otherwise oriented and the spatially relative descriptors used herein interpreted accordingly.

Figure 1:
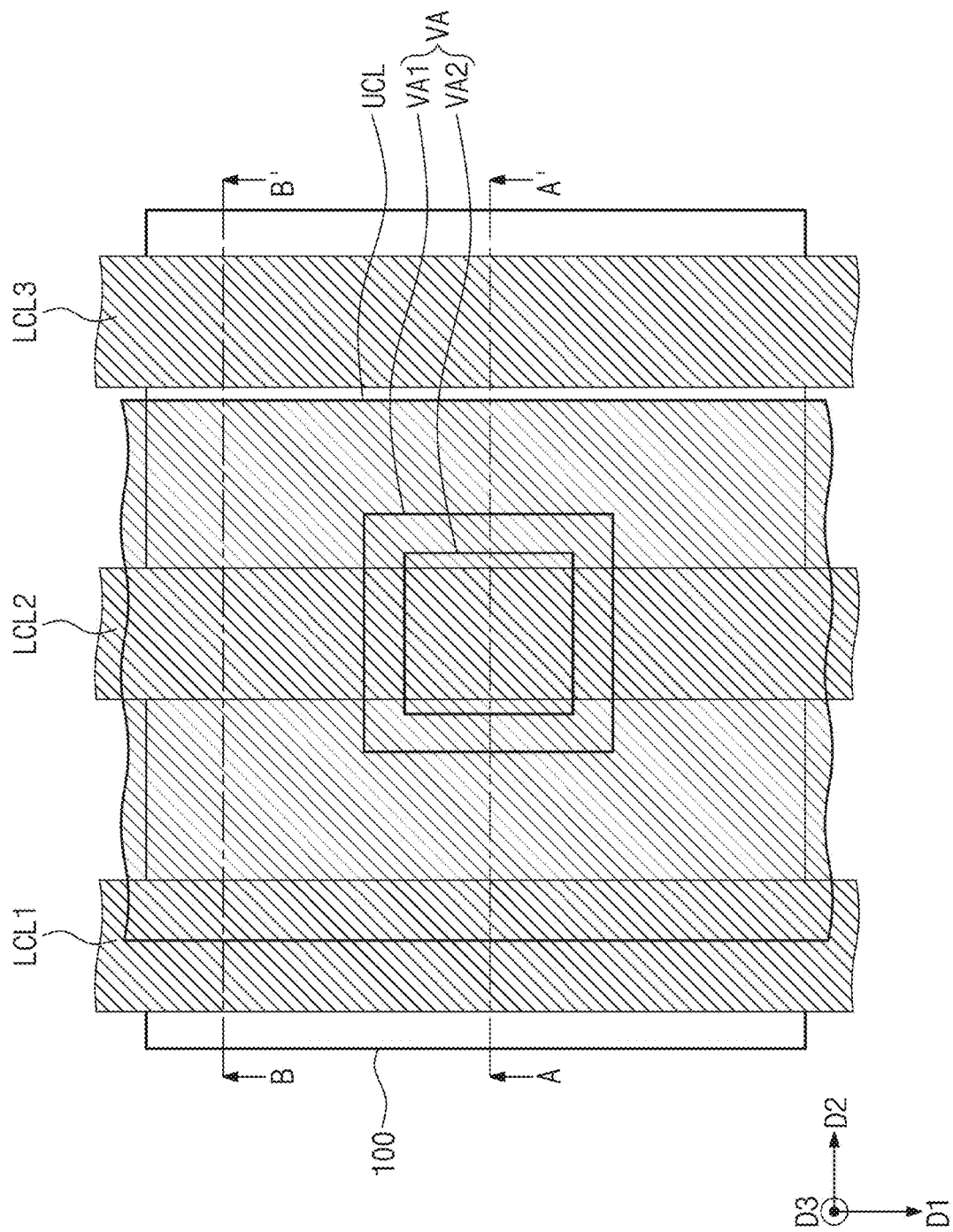
FIG. 1 illustrates a plan view showing a semiconductor device according to some example embodiments.
Figure 2A:
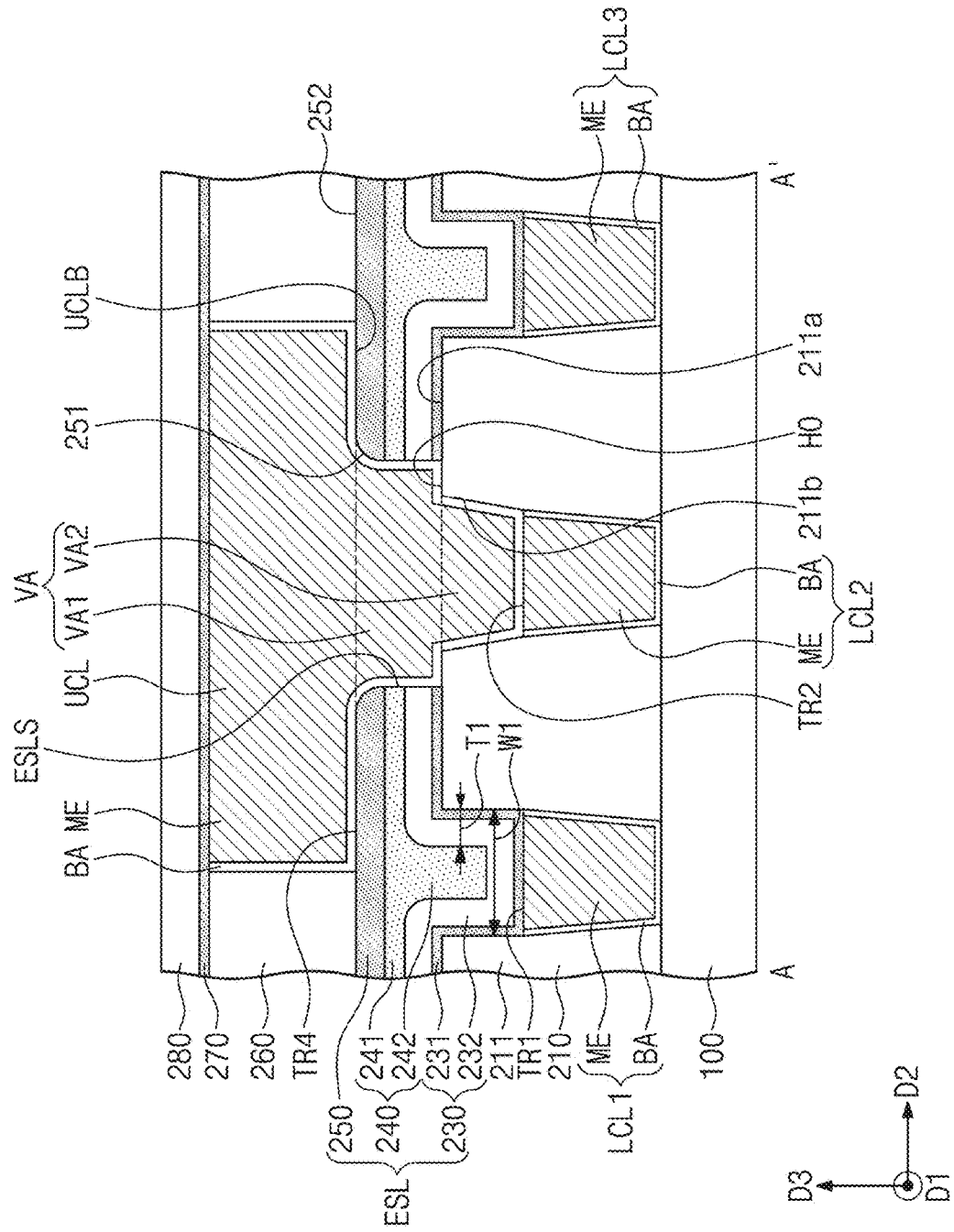
FIG. 2A illustrates a cross-sectional view taken along line A-A' of FIG. 1.

FIG. 1 illustrates a plan view showing a semiconductor device according to some example embodiments. FIG. 2A illustrates a cross-sectional view taken along line A-A' of FIG. 1. FIG. 2B illustrates a cross-sectional view taken along line B-B' of FIG. 1.

Referring to FIGS. 1, 2A, and 2B, a first dielectric layer 210 may be on a substrate 100. The substrate 100 may be a semiconductor substrate. For example, the substrate 100 may be a silicon substrate, a germanium substrate, or a silicon-germanium substrate. The substrate 100 may have transistors and/or memory cells formed thereon. The first dielectric layer 210 may be an electrical insulator. For example, the first dielectric layer 210 may be a silicon oxide layer, a silicon oxynitride layer, or a combination thereof.

First, second, and third lower conductive lines LCL1, LCL2, and LCL3 may be imbedded the first dielectric layer 210. Each of the first, second, and third lower conductive lines LCL1, LCL2, and LCL3 may be electrically connected to transistors and/or memory cells in the substrate 100. Each of the first, second, and third lower conductive lines LCL1, LCL2, and LCL3 may have a bar or linear shape that extends in a first direction D1. The first direction D1 may be parallel to a top surface of the substrate 100. The first, second, and third lower conductive lines LCL1, LCL2, and LCL3 may be spaced apart from each other in a second direction D2. For example, the first, second, and third lower conductive lines LCL1, LCL2, and LCL3 may be sequentially arranged along the second direction D2. The second direction D2 may be parallel to the top surface of the substrate 100 and may intersect the first direction D1. A third direction D3 may be perpendicular to the top surface of the substrate 100.

Each of the first, second, and third lower conductive lines LCL1, LCL2, and LCL3 may include a barrier layer BA and a metal line ME. The barrier layer BA may conformally cover sidewalls and a bottom surface of the metal line ME. The barrier layers BA may include a chemically stable metal or composite, for example, Ta, TaN, Ti, TiN, or a combination thereof. The metal lines ME may include a conductive metal, for example, Cu, W, Al, Co, or alloys thereof.

The first dielectric layer 210 may include dielectric patterns 211. The dielectric patterns 211 may be patterned in an upper portion of the first dielectric layer 210. The dielectric patterns 211 may be defined to refer to portions of the first dielectric layer 210 that are located at a higher level than those of the top surfaces of the first, second, and third lower conductive lines LCL1, LCL2, and LCL3. The dielectric patterns 211 may extend in the first direction D1. The dielectric patterns 211 may be sequentially arranged along the second direction D2. For example, the dielectric patterns 211 may be spaced apart from each other in the second direction D2.

First, second, and third trenches TR1, TR2, and TR3 may be defined by sidewalls of the dielectric patterns 211 and the top surfaces of the first, second, and third lower conductive lines LCL1, LCL2, and LCL3 respectively. For example, the first trench TR1 may be provided on the first lower conductive line LCL1, the second trench TR2 may be provided on the second lower conductive line LCL2, and the third trench TR3 may be provided on the third lower conductive line LCL3. The first, second, and third trenches TR1, TR2, and TR3 may extend in the first direction D1. The first, second, and third trenches TR1, TR2, and TR3 may be sequentially arranged along the second direction D2. Each of the first, second, and third trenches TR1, TR2, and TR3 may be provided between two dielectric patterns 211. The first, second, and third trenches TR1, TR2, and TR3 may have the same width in the second direction D2. A first width W1 may be defined as the width in the second direction D2 of each of the first, second, and third trenches TR1, TR2, and TR3.

Sidewalls 211b of the dielectric patterns 211 adjacent to the second lower conductive line LCL2 may incline relative to the top surface of the substrate 100, thus having a slope relative to the plane of the top surface of the substrate 100.

An etch stop layer ESL may be on the first dielectric layer 210. The etch stop layer ESL may cover the first dielectric layer 210 and the first, second, and third lower conductive lines LCL1, LCL2, and LCL3.

The etch stop layer ESL may include a first etch stop pattern 230, a second etch stop pattern 240, and a third etch stop pattern 250.

The first etch stop pattern 230 may conformally cover the first dielectric layer 210 and the top surfaces of the first, second, and third lower conductive lines LCL1, LCL2, and LCL3. The first etch stop pattern 230 may partially fill the first, second, and third trenches TR1, TR2, and TR3.

The first etch stop pattern 230 may include a lower layer 231 and an upper layer 232. Each of the lower and upper layers 231 and 232 may have a uniform thickness. The thickness of the lower layer 231 may be less than that of the thickness of the upper layer 232. The lower layer 231 may include an aluminum-based ceramic, for example, one or more of AlOx, AlN, and AlOC. The upper layer 232 may include a silicon-based ceramic, for example, one or more of SiOC and SiCN. The thickness of the upper layer 232 may be two to four times the thickness of the lower layer 231. For example, the thickness of the lower layer 231 may be about 10 Å, and the thickness of the upper layer 232 may be about 30 Å.

A first thickness T1 may be defined as a thickness of the first etch stop pattern 230. Double the first thickness T1 may be less than the first width W1. Therefore, the first etch stop pattern 230 may not completely fill the first, second, and third trenches TR1, TR2, and TR3.

The second etch stop pattern 240 may be on the first etch stop pattern 230. The second etch stop pattern 240 may include a base segment 241 that also extends in the second direction D2 and filling segments 242 that protrude from the base segment 241 toward the substrate 100. The first and third trenches TR1 and TR3 may be filled with the filling segments 242. The second trench TR2 may be filled with the filling segments 242 and a via-structure VA which will be discussed below. The second etch stop pattern 240 may include silicon-carbon based ceramics, for example, one or more of SiOC, SiCN, and SiCOH. The second etch stop pattern 240 may be comprised of the same material elements to those of the upper layer 232 of the first etch stop pattern 230, for example, SiOC and SiCN. However, the composition of the second etch stop pattern 240 may be different from that of the composition of the upper layer 232 of the first etch stop pattern 230.

The first and second etch stop patterns 230 and 240 may have flat sidewalls. The flat sidewalls of the first and second etch stop patterns 230 and 240 may be perpendicular to a top surface of the dielectric layer 210. The flat sidewalls may be in contact with a via-structure VA, which will be discussed below.

The third etch stop pattern 250 may be conformally on the second etch stop pattern 240. The third etch stop pattern 250 may also extend in the second direction D2. For example, the third etch stop pattern 250 may extend parallel to the top surface of the substrate 100. The third etch stop pattern 250 may include one or more aluminum ceramic materials, for example, AlOx, AlN, and AlDC. The third etch stop pattern 250 may have a thickness of, for example, about 15 Å to about 30 Å.

A hole HO may be defined by the space contained between the top surfaces 211a of the dielectric patterns 211 and the sidewall ESLS of the etch stop layer ESL. The hole HO may be provided on the second trench TR2. The hole HO may connect to the second trench TR2. The hole HO may have a width in the second direction D2 greater than a width in the second direction D2 of the second trench TR2. A thickness in the first direction D1 of the hole HO may be similar to the thickness in the second direction D2 of the hole HO. The hole HO may penetrate the etch stop layer ESL.

The third etch stop pattern 250 may have a rounded surface 251. The rounded surface 251 of the third etch stop pattern 250 may connect a top surface 252 of the third etch stop pattern 250 to a sidewall of the second etch stop pattern 240, thus transitioning from the top surface 252 of the third etch stop pattern 250 to the flat sidewall ESLS of the etch stop layer ESL. The rounded surface 251 of the third etch stop pattern 250 may be in contact with a via-structure VA which will be discussed below. The rounded surface 251 may be defined as top corner rounding (TCR).

A second dielectric layer 260 may be provided on the third etch stop pattern 250. The second dielectric layer 260 may be formed of a low-k dielectric layer having a low dielectric constant of about 2.2 to about 3.0. For example, the second dielectric layer 260 may include SiCOH.

A fourth trench TR4 may be in the second dielectric layer 260. The fourth trench TR4 may be defined by the space between a sidewall of the second dielectric layer 260 and the top surface 252 of the third etch stop pattern 250. The fourth trench TR4 may be on the hole HO and may be connected to the hole HO. The fourth trench TR4 may have a width in the second direction D2 greater than the width in the second direction D2 of the hole HO. The fourth trench TR4 may extend in the first direction D1.

A via-structure VA may be provided to fill the hole HO and a portion of the second trench TR2. The via-structure VA may penetrate the etch stop layer ESL. The via-structure VA may be electrically connected to the second lower conductive line LCL2. The via-structure VA may include a first segment VA1 that fills the hole HO and a second segment VA2 that fills a portion of the second trench TR2. A width in the second direction D2 of the first segment VA1 may be greater than a width in the second direction D2 of the second segment VA2.

The first segment VA1 of the via-structure VA may be in contact with the sidewall ESLS of the etch stop layer ESL and with the top surfaces 211a of the dielectric patterns 211. The first segment VA1 may have a sidewall in contact with the sidewall ESLS of the etch stop layer ESL and a bottom surface in contact with the top surfaces 211a of the dielectric patterns 211. The first segment VA1 of the via-structure VA may have a rounded sidewall along the rounded surface 251 of the third etch stop pattern 250.

The second segment VA2 of the via-structure VA may be in contact with the sidewalls 211b of the dielectric patterns 211 adjacent to the second lower conductive line LCL2 and with the top surface of the second lower conductive line LCL2. The second segment VA2 may have a sidewall in contact with the sidewall 211b of the dielectric pattern 211 and a bottom surface in contact with the top surface of the second lower conductive line LCL2.

An upper conductive line UCL may fill the fourth trench TR4. The upper conductive line UCL may penetrate the second dielectric layer 260 and may contact a top surface of the etch stop layer ESL. For example, the upper conductive line UCL may have a bottom surface UCLB in contact with the top surface 252 of the third etch stop pattern 250. The upper conductive line UCL may be electrically connected through the via-structure VA to the second lower conductive line LCL2. Similar to the first, second, and third lower conductive lines LCL1, LCL2, and LCL3, the upper conductive line UCL and the via-structure VA may each include a metal line ME and a barrier layer BA. The via-structure VA and the upper conductive line UCL may be segments of a structure that are formed at the same time, as discussed in the following fabrication method.

A first capping layer 270 may be provided to cover the second dielectric layer 260 and the upper conductive line UCL. The first capping layer 270 may include an aluminum-based ceramic, for example, one or more of AlOx, AlN, and AlOC.

A second capping layer 280 may be provided on the first capping layer 270. The second capping layer 280 may include a silicon-carbon based ceramic, for example, one or more of SiOC and SiCN.

FIGS. 3A, 3B, 3C, and 3D illustrate cross-sectional views showing a method of fabricating a semiconductor device according to some example embodiments of the present inventive concepts.

Figure 3A:
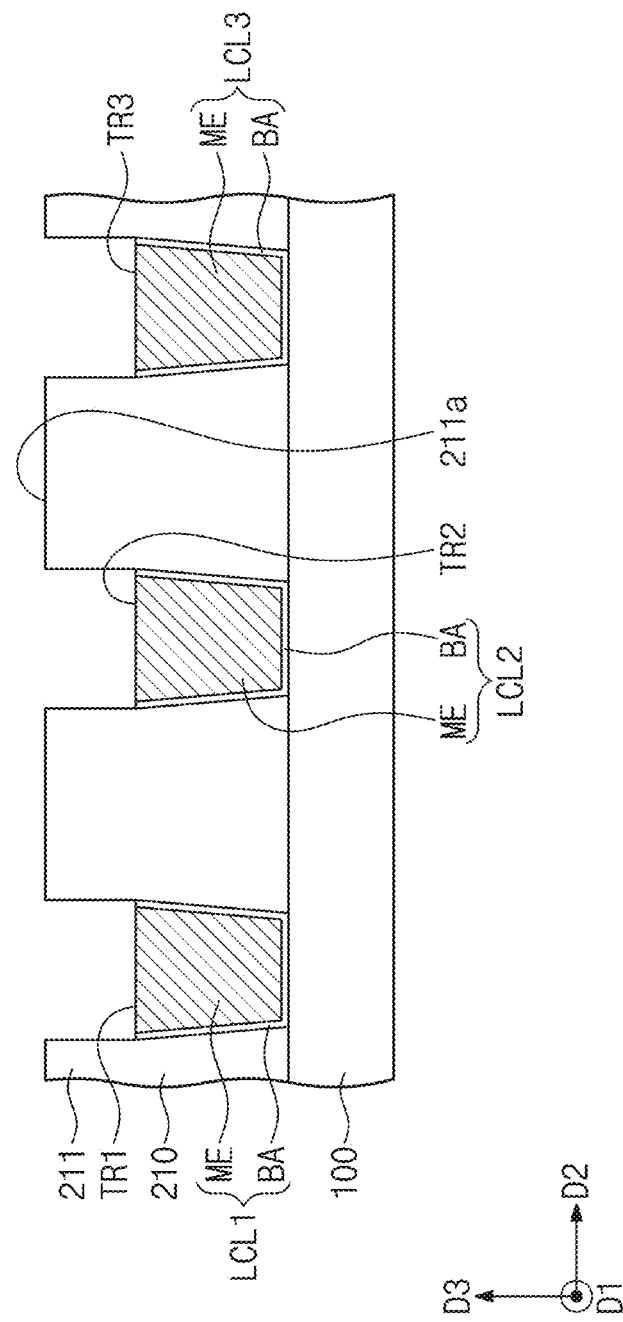
FIGS. 3A, 3B, 3C, and 3D illustrate cross-sectional views showing a method of fabricating a semiconductor device according to some example embodiments.

Referring to FIG. 3A, a first dielectric layer 210 may be formed on a substrate 100, and first, second, and third lower conductive lines LCL1, LCL2, and LCL3 may be formed in the first dielectric layer 210.

For example, the formation of the first, second, and third lower conductive lines LCL1, LCL2, and LCL3 may include forming in the first dielectric layer 210 trenches to partially expose a top surface of the substrate 100, conformally forming a barrier material to cover the first dielectric layer 210 and the substrate 100, forming a metallic material on the barrier material, performing a planarization process in which the barrier material and the metallic material are partially removed to expose a top surface of the first dielectric layer 210, and partially removing the metallic material and the barrier material from the trenches to form the first, second, and third lower conductive lines LCL1, LCL2, and LCL3. The removal of the metallic material and the barrier material from the trenches may define dielectric patterns 211 in an upper portion of the first dielectric layer 210.

For another example, the formation of the first, second, and third lower conductive lines LCL1, LCL2, and LCL3 may include forming in the first dielectric layer 210 trenches to partially expose the top surface of the substrate 100, conformally forming a barrier material to cover the first dielectric layer 210 and the substrate 100, forming a metallic material on the barrier material, performing a planarization process in which the barrier material, the metallic material, and the first dielectric layer 210 are partially removed to form the first, second, and third lower conductive lines LCL1, LCL2, and LCL3, and forming the dielectric patterns 211 on the first dielectric layer 210.

As shown above, the first, second, and third trenches TR1, TR2, and TR3 may be formed as part of the formation of the first, second, and third lower conductive lines LCL1, LCL2, and LCL3.

Figure 3B:
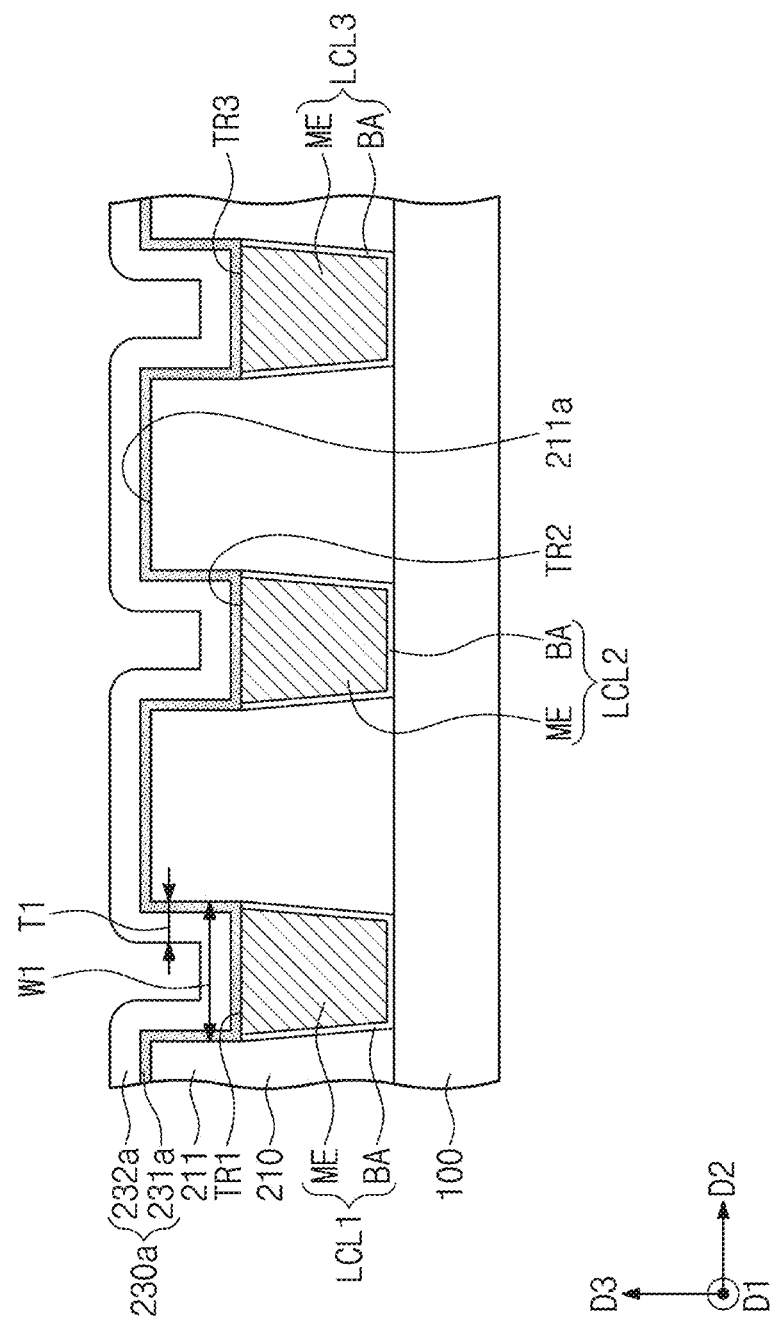

Referring to FIG. 3B, a first preliminary layer 230a may be formed. The first preliminary layer 230a may include a lower preliminary layer 231a and an upper preliminary layer 232a. The first preliminary layer 230a may be formed to conformally cover the first dielectric layer 210 and the first, second, and third lower conductive lines LCL1, LCL2, and LCL3.

A first thickness T1 may be defined to indicate a thickness of the first preliminary layer 230a. A first width W1 may be defined to indicate a width in a second direction D2 of each of the first, second, and third trenches TR1, TR2, and TR3. A double of the first thickness T1 may be less than the first width W1. Thus, the first preliminary layer 230a may not completely fill the first, second, and third trenches TR1, TR2, and TR3.

Figure 3C:
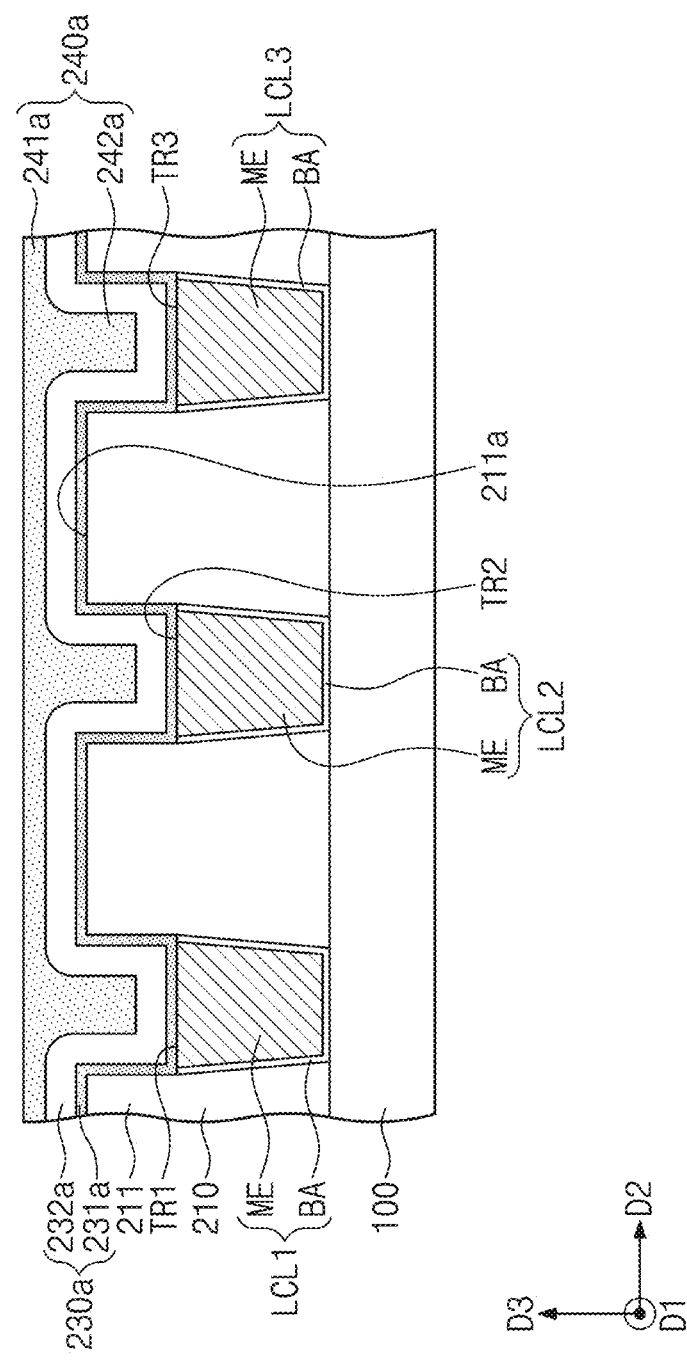

Referring to FIG. 3C, a second preliminary layer 240a may be formed on the first preliminary layer 230a. The second preliminary layer 240a may be formed, for example, by a flowable chemical vapor deposition (FCVD) process, a spin-on-glass (SOG) process, or a plasma enhanced chemical vapor deposition (PECVD) process.

The second preliminary layer 240a may include a base segment 241a that extends in the second direction D2 and filling segments 242a that protrude from the base segment 241a toward the substrate 100. The first, second, and third trenches TR1, TR2, and TR3 may be completely filled with the filling segments 242a. The base segment 241a may be formed on the filling segments 242a.

The formation of the second preliminary layer 240a may include performing a planarization process to reduce the thickness of the base segment 241a. Alternatively, the formation of the second preliminary layer 240a may not include the planarization process. Even when no planarization process is performed, the second preliminary layer 240a may have a flat top surface.

Figure 3D:
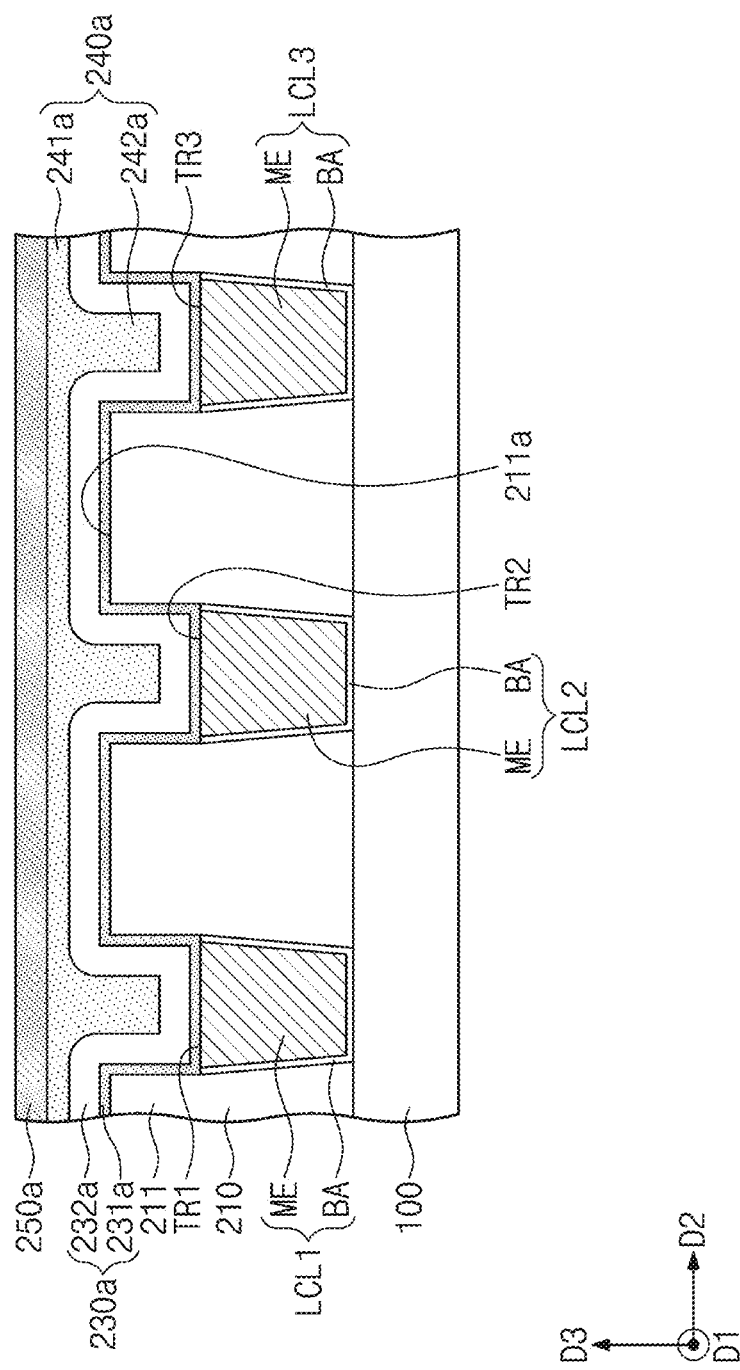

Referring to FIG. 3D, a third preliminary layer 250a may be formed on the second preliminary layer 240a. Referring back to FIGS. 2A and 2B, a second dielectric layer 260 may be formed on the third preliminary layer 250a. A fourth trench TR4 and a hole HO may be formed, and the second trench TR2 may be opened again at its portion below the hole HO. The fourth trench TR4 may be formed by patterning the second dielectric layer 260. The third preliminary layer 250a may serve as an etch stop layer when the second dielectric layer 260 is patterned. The hole HO may be formed by patterning the first, second, and third preliminary layers 230a, 240a, and 250a. When the hole HO is formed, the first, second, and third preliminary layers 230a, 240a, and 250a may be patterned into first, second, and third etch stop patterns 230, 240, and 250. The formation of the hole HO may include patterning the third preliminary layer 250a by using the second preliminary layer 240a as an etch stop layer, and patterning the first and second preliminary layers 230a and 240a. When the first and second preliminary layers 230a and 240a are patterned, a rounded surface 251 may be formed on the third etch stop pattern 250.

A portion of the second trench TR2 may be opened again due to the removal of the second preliminary layer 240a and the first preliminary layer 230a that partially fill the second trench TR2 below the hole HO. When the portion of the second trench TR2 is opened again, exposed sidewalls 211b of the dielectric patterns 211 may have slopes relative to the top surface of the substrate 100.

A via-structure VA and an upper conductive line UCL may be formed. The formation of the via-structure VA and the upper conductive line UCL may include conformally forming a barrier material on an entire surface of the substrate 100, forming a metallic material on the barrier material, and performing a planarization process to partially remove the barrier and metallic materials.

Because the rounded surface 251 is formed on the third etch stop pattern 250, a sufficient fill margin may be obtained while the via-structure VA is formed.

A first capping layer 270 may be formed to cover the upper conductive line UCL and the second dielectric layer 260. A second capping layer 280 may be formed on the first capping layer 270.

FIGS. 4, 5, 6, 7, 8, 9, and 10 illustrate cross-sectional views showing a semiconductor device according to some example embodiments of the present inventive concepts. Except for the following description, the aforementioned discussion related to the semiconductor device of FIGS. 1, 2A, and 2B is identically or similarly applicable to the embodiments below.

Figure 4:
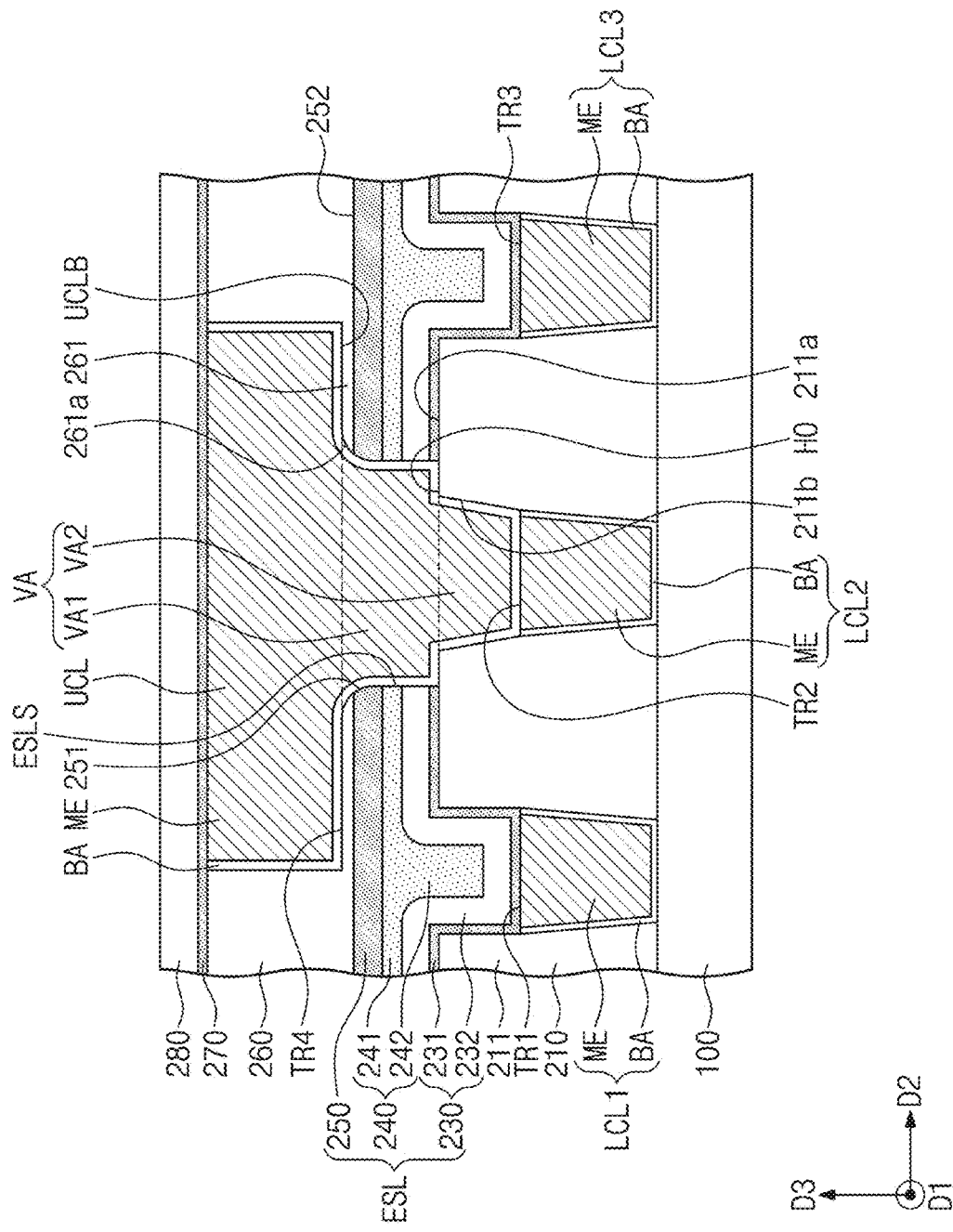
FIGS. 4, 5, 6, 7, 8, 9, and 10 illustrate cross-sectional views showing a semiconductor device according to some example embodiments.

Referring to FIG. 4, a semiconductor device according to an example embodiment may be configured such that the upper conductive line UCL may be spaced apart from the third etch stop pattern 250. The second dielectric layer 260 may include an insert segment 261 below the upper conductive line UCL. The insert segment 261 may be interposed between the upper conductive line UCL and the top surface 252 of the third etch stop pattern 250. The insert segment 261 may have a rounded surface 261a in contact with the first segment VA1 of the via-structure VA.

Figure 5:
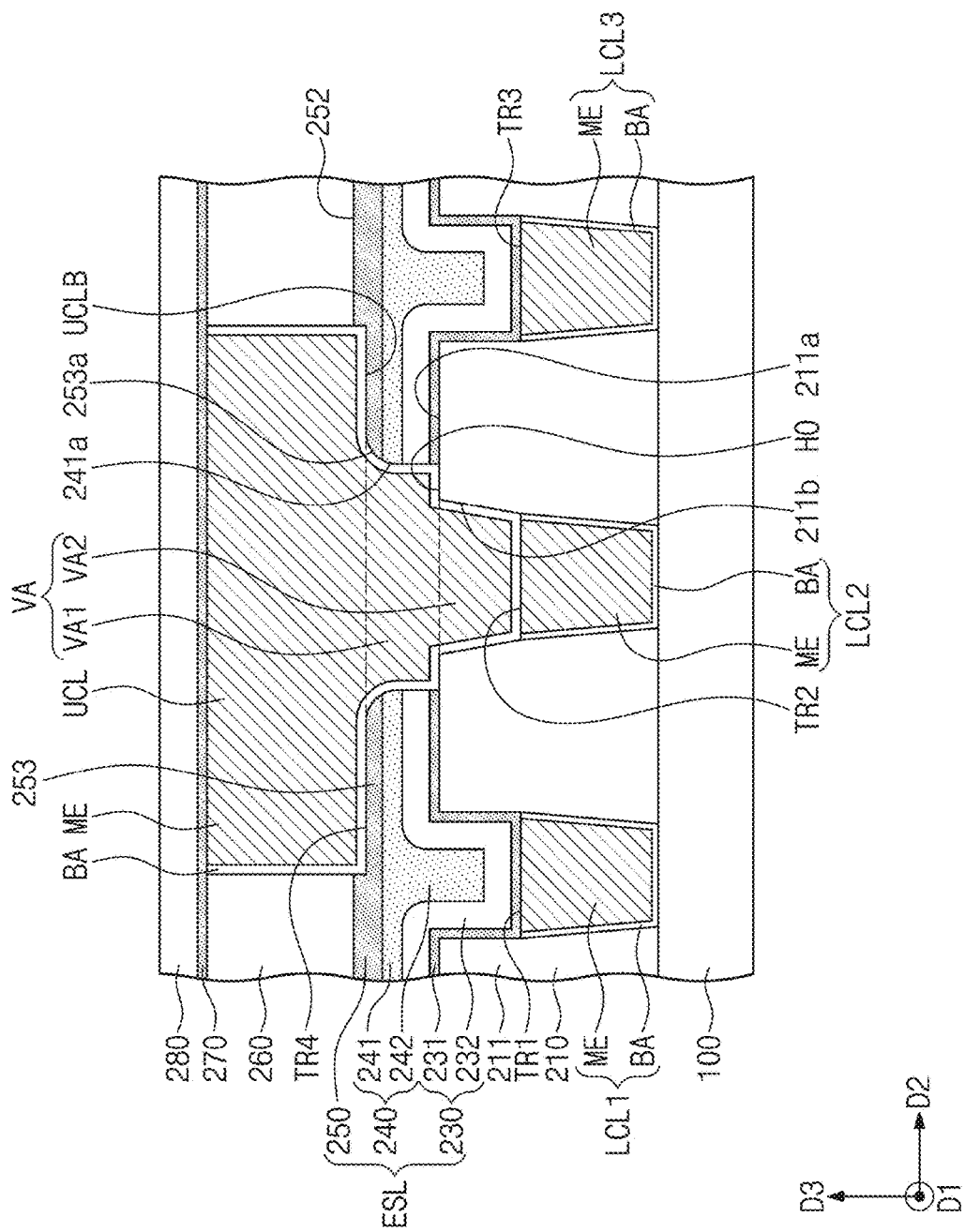

Referring to FIG. 5, a semiconductor device according to an example embodiment may be configured such that the third etch stop pattern 250 may include an insert segment 253. The insert segment 253 may be disposed below the upper conductive line UCL.

The bottom surface UCLB of the upper conductive line UCL may be located at a lower level than that of the top surface 252 of the third etch stop pattern 250. The insert segment 253 may have a top surface at a lower level than that of the top surface 252. The top surface 252 may correspond to an uppermost surface of the third etch stop pattern 250. The insert segment 253 may have a rounded surface 253a in contact with the first segment VA1 of the via-structure VA.

Figure 6:
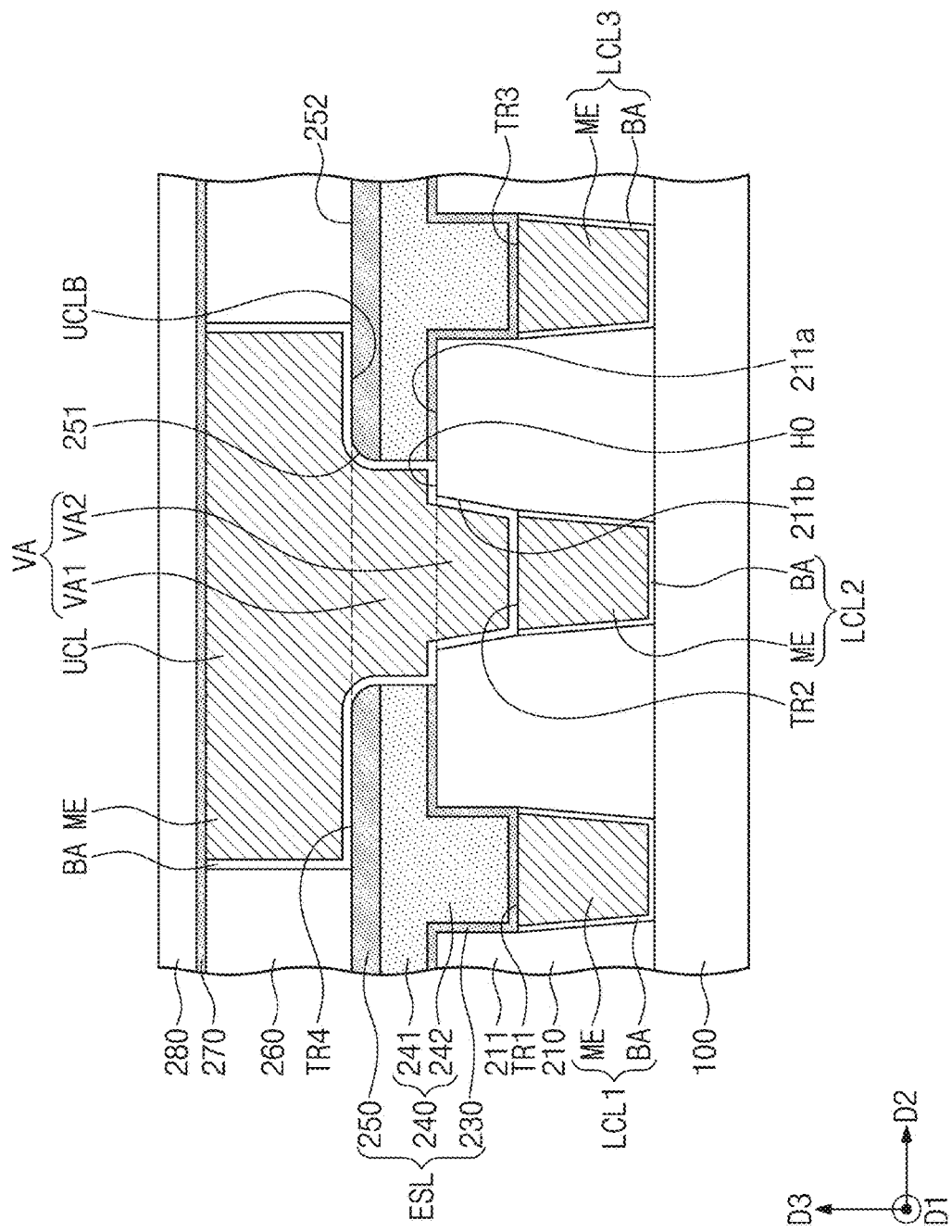

Referring to FIG. 6, a semiconductor device according to an example embodiment may be configured such that the first etch stop pattern 230 is formed of a single layer. The first etch stop pattern 230 in the semiconductor device according to an example embodiment may be the same as the lower layer 231 of the first etch stop pattern 230 in the semiconductor device discussed above with reference to FIGS. 1, 2A, and 2B.

In the semiconductor device according to an example embodiment, the second etch stop pattern 240 may include the base segment 241 that extends in the second direction D2 and the filling segment 242 that protrudes from the base segment 241 toward the substrate 100.

In the semiconductor device according to an example embodiment, the second etch stop pattern 240 may be formed by a single precursor activated radical chemistry (SPARC) process.

Figure 7:
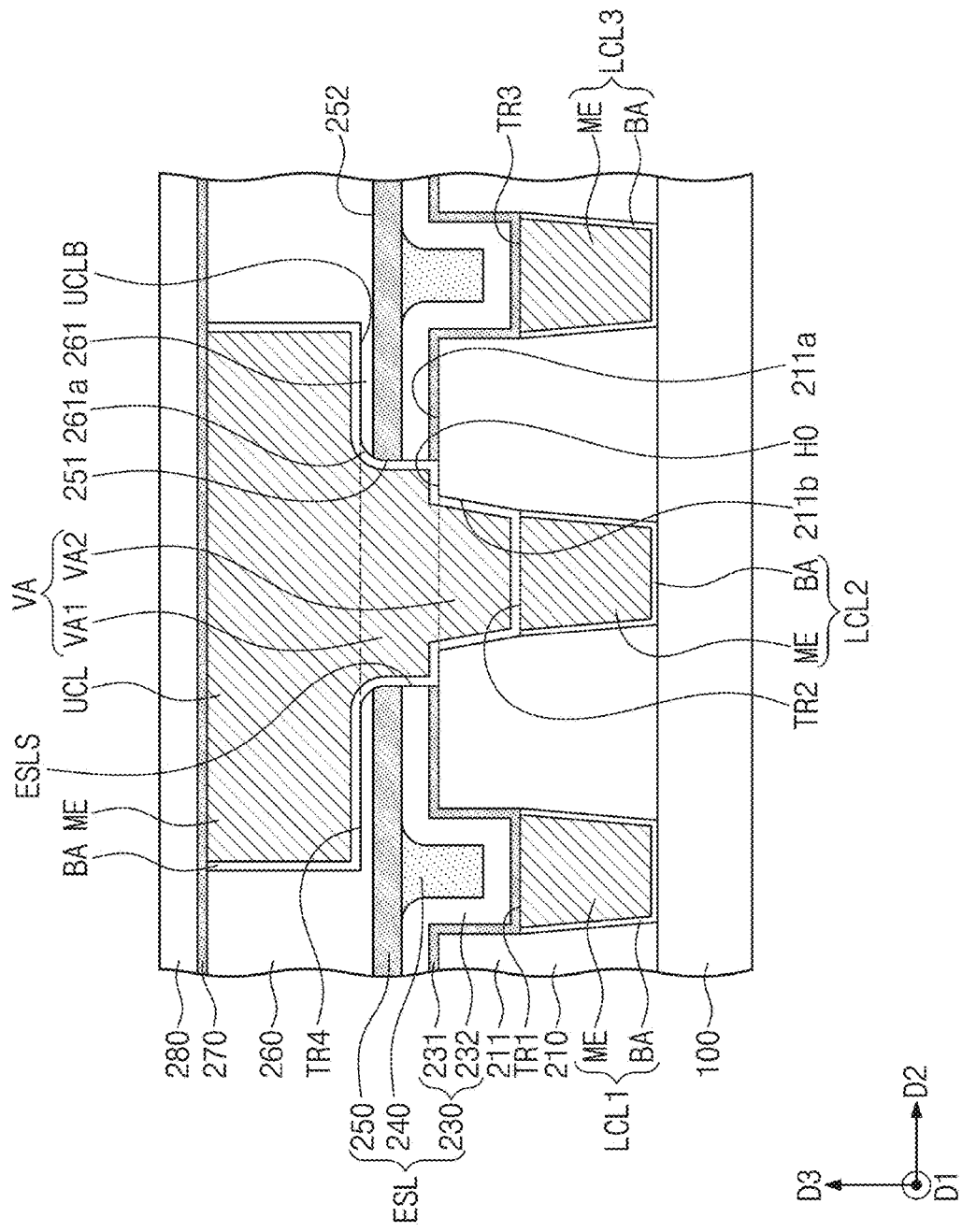

Referring to FIG. 7, a semiconductor device according to an example embodiment may be configured such that the second etch stop pattern 240 may not include the base segment 241 of the semiconductor device discussed above with reference to FIGS. 1, 2A, and 2B. In the semiconductor device according to an example embodiment, the second etch stop pattern 240 may have a top surface coplanar with that of the top surface of the first etch stop pattern 230. When a planarization process is performed on the second preliminary layer 240a as discussed in FIG. 3C, the base segment 241a of the second preliminary layer 240a may be completely removed to form the second etch stop pattern 240 according to the present inventive concepts.

The third etch stop pattern 250 may be in contact with the first and second etch stop patterns 230 and 240.

The second dielectric layer 260 may include an insert segment 261 disposed below the upper conductive line UCL.

Figure 8:
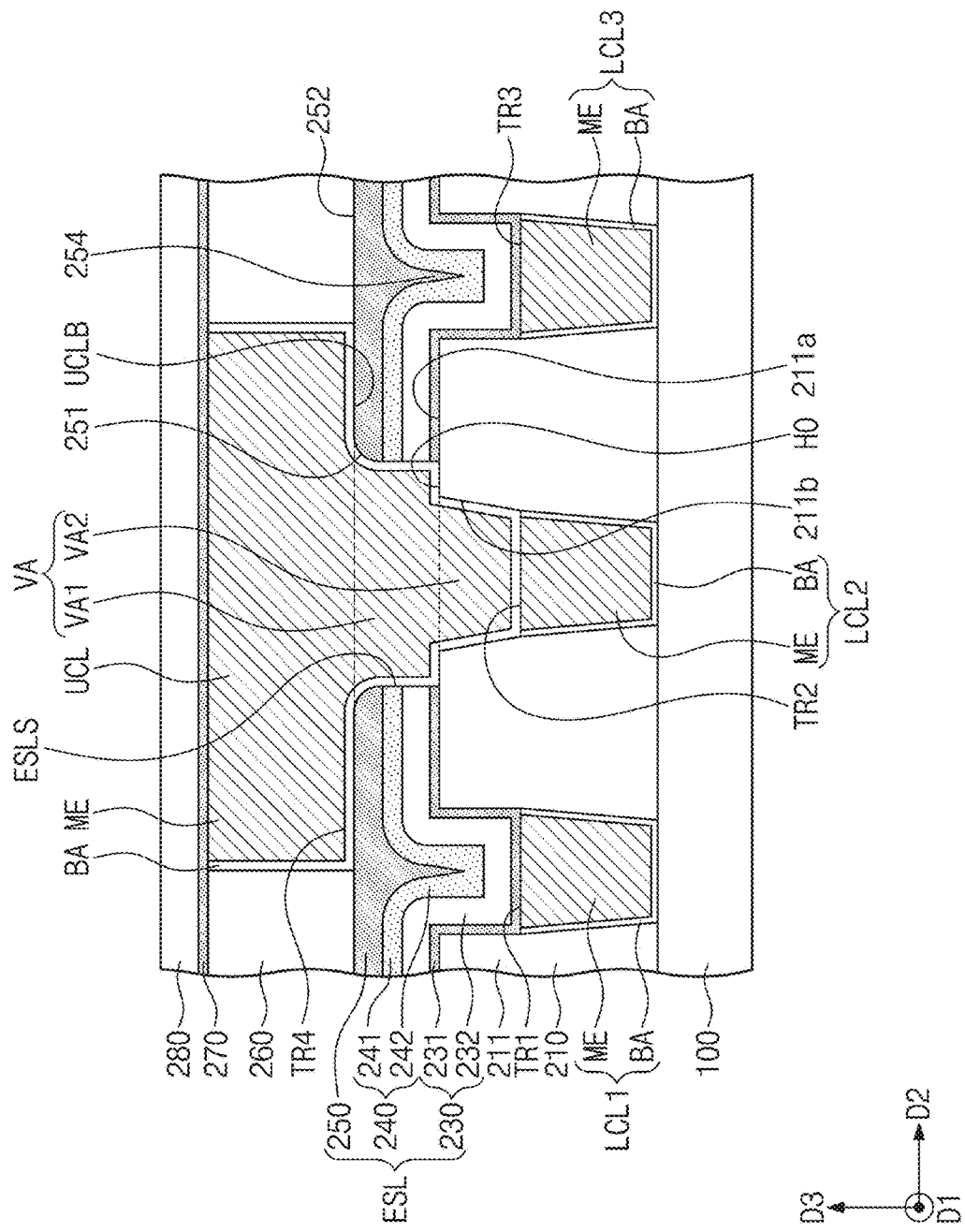

Referring to FIG. 8, a semiconductor device according to an example embodiment may be configured such that the third etch stop pattern 250 may include a protrusion 254. The protrusion 254 may protrude in a direction toward the substrate 100 from a bottom surface of the third etch stop pattern 250. The protrusion 254 may be partially penetrate the second etch stop pattern 240. The protrusion 254 may have a lowermost portion in the filling segment 242 of the second etch stop pattern 240.

Figure 9:
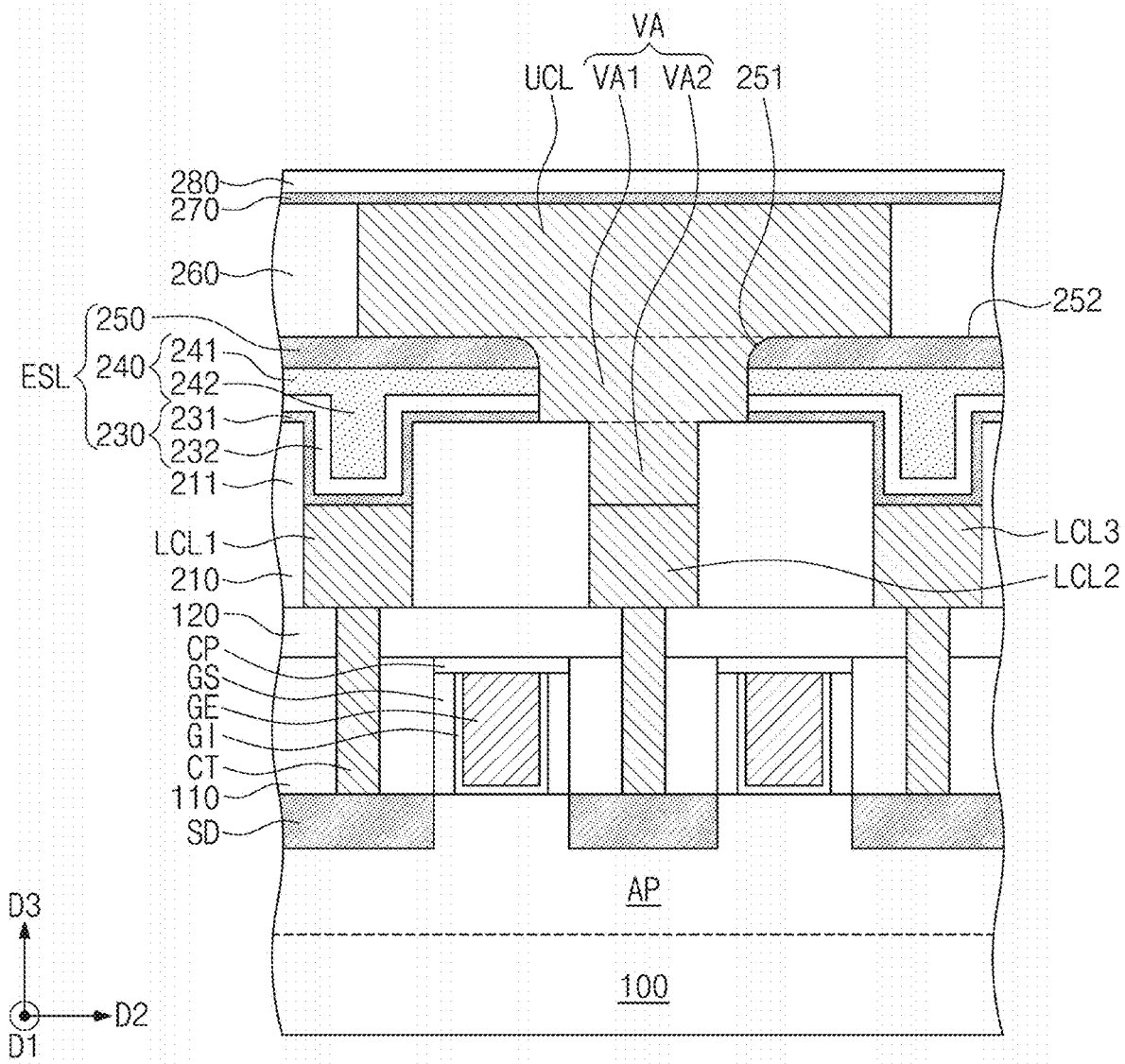

Referring to FIG. 9, a semiconductor device according to an example embodiment may be configured such that an active pattern AP may be defined on an upper portion of the substrate 100. The substrate 100 may be a semiconductor substrate, for example, a silicon substrate, a germanium substrate, or a silicon-germanium substrate. Source/drain patterns SD may be in the active pattern AP. The source/drain patterns SD may include a semiconductor material doped with p-type or n-type impurities. Gate spacers GS, gate dielectric layers GI, gate electrodes GE, and gate capping patterns CP may be on the active pattern AP. The gate electrode GE may be between two gate spacers GS. The gate dielectric layer GI may cover a bottom surface and a sidewall of the gate electrode GE. The gate capping pattern CP may cover the top surfaces of the gate spacers GS, a top surface of the gate dielectric layer GI, and a top surface of the gate electrode GE.

A first lower dielectric layer 110 may cover the source/drain patterns SD. A second lower dielectric layer 120 may cover the first lower dielectric layer 110 and the gate capping patterns CP.

Contacts CT may penetrate the first and second lower dielectric layers 110 and 120 and to have connection with corresponding source/drain patterns SD.

The first dielectric layer 210 may be on the second lower dielectric layer 120.

The first, second, and third lower conductive lines LCL1, LCL2, and LCL3 may be embedded in the first dielectric layer 210. The first, second, and third lower conductive lines LCL1, LCL2, and LCL3 may be are connected to corresponding contacts CT.

The etch stop layer ESL may be on the first dielectric layer 210. The via-structure VA and the upper conductive line UCL may be on the second lower conductive line LCL2.

The second dielectric layer 260 may be on the etch stop layer ESL, the first capping layer 270 may be on the second dielectric layer 260, and the second capping layer 280 may be on the first capping layer 270.

Figure 10:
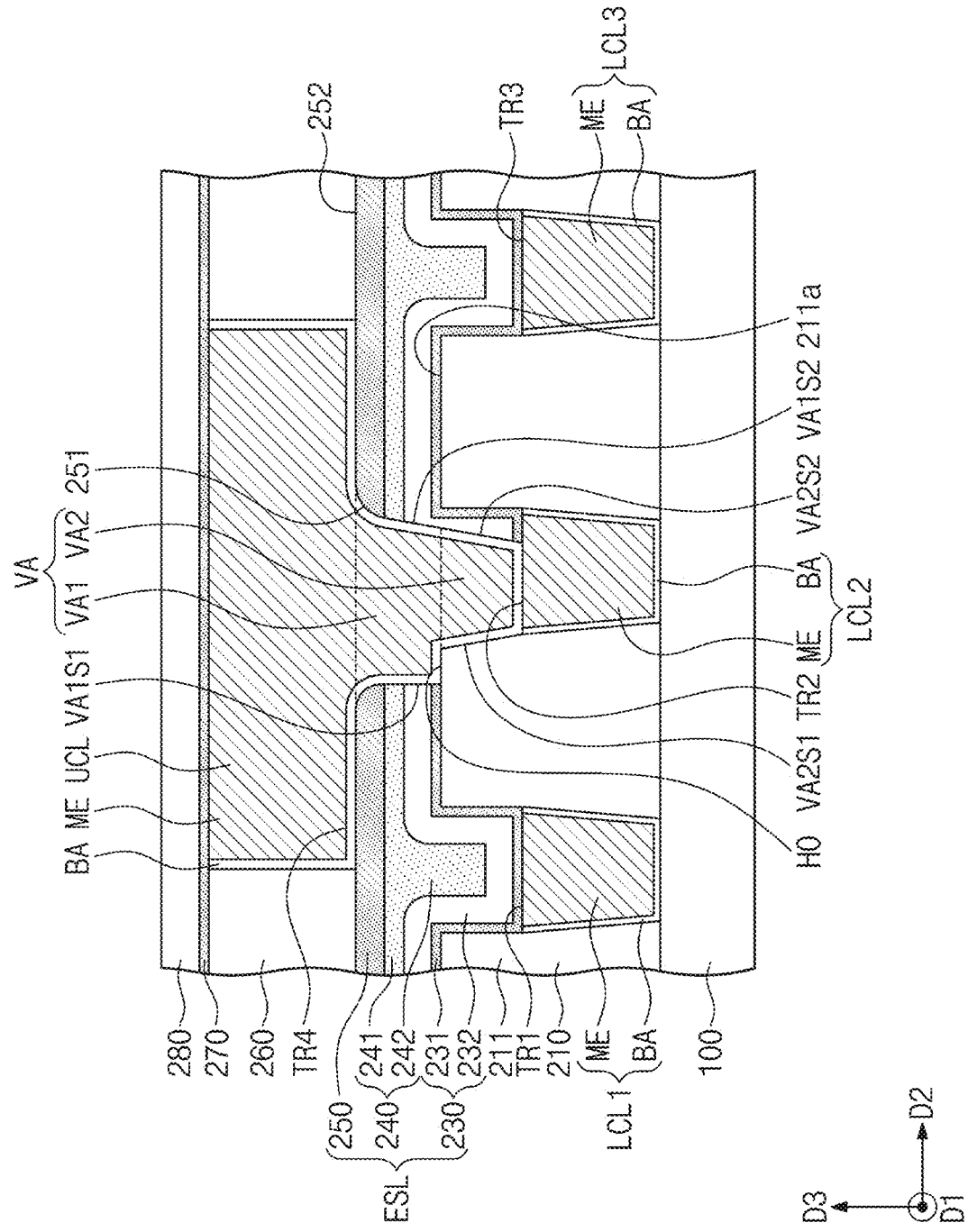

Referring to FIG. 10, a semiconductor device according to an example embodiment may be configured such that the first segment VA1 of the via-structure VA may have a first sidewall VA1S1 and a second sidewall VA1S2. The first sidewall VA may be parallel to the third direction D3. For example, the first sidewall VA1S1 may be perpendicular to the top surface of the substrate 100. The second sidewall VA1S2 may have a slope relative to the first sidewall VA1S1. For example, the second sidewall VA1S2 may have a slope relative to the top surface of the substrate 100. The second segment VA2 of the via-structure VA may only partially fill the second trench TR2. For example, the second segment VA2 of the via-structure VA may not completely fill the second trench TR2. The etch stop layer ESL may fill a portion of the second trench TR2, which portion is not filled with the second segment VA2 of the via-structure VA.

The second segment VA2 of the via-structure VA may have a third sidewall VA2S1 and a fourth sidewall VA2S2. The third sidewall VA2S1 may have a slope relative to the top surface of the substrate 100. The third sidewall VA2S1 may be in contact with a sidewall of the dielectric pattern 211, which sidewall faces the third sidewall VA2S1. The fourth sidewall VA2S2 may have a slope relative to the top surface of the substrate 100. The fourth sidewall VA2S2 may be spaced apart from a sidewall of the dielectric pattern 211. The etch stop layer ESL may fill a space between the fourth sidewall VA2S2 and the facing sidewall of the dielectric pattern 211. The fourth sidewall VA2S2 may be coplanar with the second sidewall VA1S2.

According to the present inventive concepts, a semiconductor device may include an etch stop layer with a rounded surface, and thus the semiconductor device may increase in via-fill margin.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor device, comprising:
   a substrate;
   an active pattern on the substrate, the active pattern having an upper portion that protrudes upwardly;
   a source/drain pattern on the substrate;
   a gate electrode on the substrate;
   a lower dielectric layer that covers the source/drain pattern;
   a contact that penetrate the lower dielectric layer and is connected to the source/drain pattern;
   a first dielectric layer on the lower dielectric layer;
   a first lower conductive line in the first dielectric layer and connected to the contact;
   an etch stop layer on the first dielectric layer;
   a via-structure that penetrates the etch stop layer and is connected to the first lower conductive line; and
   an upper conductive line connected to the via-structure,
   wherein the first dielectric layer includes a dielectric pattern at a level higher than a top surface of the first lower conductive line, and
   wherein the etch stop layer has an upper portion with a rounded surface in contact with the via-structure.

2. The semiconductor device of claim 1, further comprising:
   a gate dielectric layer that covers a bottom surface and a sidewall of the gate electrode.

3. The semiconductor device of claim 2, further comprising:
   gate spacers, wherein the gate electrode is between the gate spacers.

4. The semiconductor device of claim 3, further comprising:
   a capping pattern that covers top surfaces of the gate spacers, a top surface of the gate dielectric layer, and a top surface of the gate electrode.

5. The semiconductor device of claim 1, wherein the etch stop layer includes:
   a first etch stop pattern;
   a second etch stop pattern on the first etch stop pattern; and
   a third etch stop pattern on the second etch stop pattern, the third etch stop pattern having the rounded surface in contact with the via-structure.

6. The semiconductor device of claim 5, wherein the second etch stop pattern includes:

a base segment that extends parallel to a top surface of the substrate; and a filling segment that protrudes from the base segment toward the substrate.

7. The semiconductor device of claim 5, further comprising:

at least a second lower conductive line in the first dielectric layer, wherein a trench is defined by a top surface of the second lower conductive line and sidewalls of the dielectric pattern, the first etch stop pattern conformally covers the trench, and the second etch stop pattern fills the trench.

8. The semiconductor device of claim 1, wherein the source/drain pattern includes a semiconductor material doped with impurities.

9. The semiconductor device of claim 1, wherein the source/drain pattern includes p-type impurities or n-type impurities.

10. The semiconductor device of claim 1, further comprising:

a second dielectric layer on the etch stop layer, wherein the upper conductive line is in the second dielectric layer.

11. A semiconductor device, comprising:

a substrate;

a first dielectric layer on the substrate;

a first lower conductive line in the first dielectric layer;

an etch stop layer on the first dielectric layer;

a via-structure that penetrates the etch stop layer and is connected to the first lower conductive line; and an upper conductive line on the via-structure and connected to the via-structure, wherein the first dielectric layer includes a dielectric pattern at a level higher than a top surface of the first lower conductive line, the via-structure includes a first segment and a second segment, the first segment being on the second segment, the first segment of the via-structure has a first sidewall and a second sidewall, the second segment of the via-structure has a third sidewall and a fourth sidewall, the fourth sidewall is coplanar with the second sidewall, the third sidewall is in contact with the dielectric pattern, and the fourth sidewall is spaced apart from the dielectric pattern.

12. The semiconductor device of claim 11, wherein a lowermost surface of the etch stop layer is located at a level lower than a top surface of the dielectric pattern.

13. The semiconductor device of claim 11, wherein the etch stop layer interposes between the fourth sidewall and a sidewall of the dielectric pattern adjacent to the fourth sidewall.

14. The semiconductor device of claim 11, wherein the first sidewall is perpendicular to a top surface of the substrate, the second sidewall has a slope relative to the top surface of the substrate, and the third sidewall has a slope relative to the top surface of the substrate.

15. The semiconductor device of claim 11, further comprising:

a second dielectric layer on the etch stop layer, wherein the upper conductive line is in the second dielectric layer, the first segment of the via-structure is in contact with a sidewall of the etch stop layer and a top surface of the dielectric pattern, and the second segment of the via-structure is in contact with a sidewall of the dielectric pattern and the top surface of a first lower conductive line.

16. The semiconductor device of claim 11, wherein the etch stop layer includes:

a first etch stop pattern;

a second etch stop pattern on the first etch stop pattern; and a third etch stop pattern on the second etch stop pattern, the third etch stop pattern having a rounded surface in contact with the via-structure.

17. The semiconductor device of claim 16, wherein the second etch stop pattern includes:

a base segment that extends parallel to a top surface of the substrate; and a filling segment that protrudes from the base segment toward the substrate.

18. The semiconductor device of claim 16, further comprising:

at least a second lower conductive line in the first dielectric layer, wherein a trench is defined by a top surface of the second lower conductive line and sidewalls of the dielectric pattern, the first etch stop pattern conformally covers the trench, and the second etch stop pattern fills the trench.

19. A semiconductor device, comprising:

a substrate;

a dielectric layer on the substrate;

a lower conductive line in the dielectric layer such that an upper most surface of the lower conductive line is below an upper most surface of the dielectric layer;

an etch stop layer on the dielectric layer;

a via-structure that penetrates the etch stop layer and is connected to the lower conductive line; and an upper conductive line on the via-structure and connected to the via-structure, wherein the via-structure partially exposes a top surface of the lower conductive line, the via-structure includes a first segment and a second segment, the first segment being on the second segment, and a width of the first segment is greater than a width of the second segment.

20. The semiconductor device of claim 19, wherein the etch stop layer covers the exposed top surface of the lower conductive line.

* * * * *